United States Patent [19]

Logan, Jr.

[11] Patent Number: 5,204,640
[45] Date of Patent: Apr. 20, 1993

[54] WIDELY TUNABLE OSCILLATOR STABILIZATION USING ANALOG FIBER OPTIC DELAY LINE

[75] Inventor: Ronald T. Logan, Jr., Altadena, Calif.

[73] Assignee: California Institute of Technology, Pasadena, Calif.

[21] Appl. No.: 832,884

[22] Filed: Feb. 10, 1992

[51] Int. Cl.$^5$ ............................ H03L 7/02; H01S 3/13
[52] U.S. Cl. ........................................... 331/9; 331/25; 372/32; 372/33
[58] Field of Search ............... 331/1 R, 9, 25; 372/32, 372/33

[56] References Cited

U.S. PATENT DOCUMENTS

| | | | |
|---|---|---|---|
| 3,614,649 | 10/1971 | Gerig | 331/17 |
| 4,042,891 | 8/1977 | Levine | 331/1 R |
| 4,336,505 | 6/1982 | Meyer | 331/1 R |

Primary Examiner—Siegfried H. Grimm
Attorney, Agent, or Firm—Robert M. Wallace

[57] ABSTRACT

A circuit for stabilizing an oscillator having an oscillator output signal includes a long optical fiber delay line which receives an optical version of the oscillator output signal and a phase detector sensing the oscillator output signal and the delayed optical output signal through the long optical fiber. The output of the phase detector is fed back to the oscillator's frequency control input to stabilize the frequency. The phase detector and the delay line are a delay line discriminator, and the length of the optical fiber is selected so as to optimize the discriminator's sensitivity against signal attenuation in the optical fiber, the optical fiber length typically being on the order of 10 kilometers. An adjustable phase shifter which maintains phase quadrature at the phase detector inputs at equilibrium is controlled by a tuning microprocessor responsive to an externally controlled change in the frequency at which the oscillator is to be stabilized, so as to follow changes in the selected oscillator frequency. As a result, an oscillator may be tuned in the circuit of the invention to any frequency in the general range of D.C. to optical frequencies.

28 Claims, 6 Drawing Sheets

WIDELY TUNABLE OSCILLATOR STABILIZATION USING ANALOG FIBER OPTIC DELAY LINE

BACKGROUND OF THE INVENTION

1. Origin of the Invention

The invention described herein was made in the performance of work under a NASA contract, and is subject to the provisions of Public Law 96-517 (35 USC 202) in which the contractor has elected to retain title.

2. Technical Field the invention is related to the stabilization of oscillator frequency and phase using a delay line discriminator.

BACKGROUND ART

Figure 1:
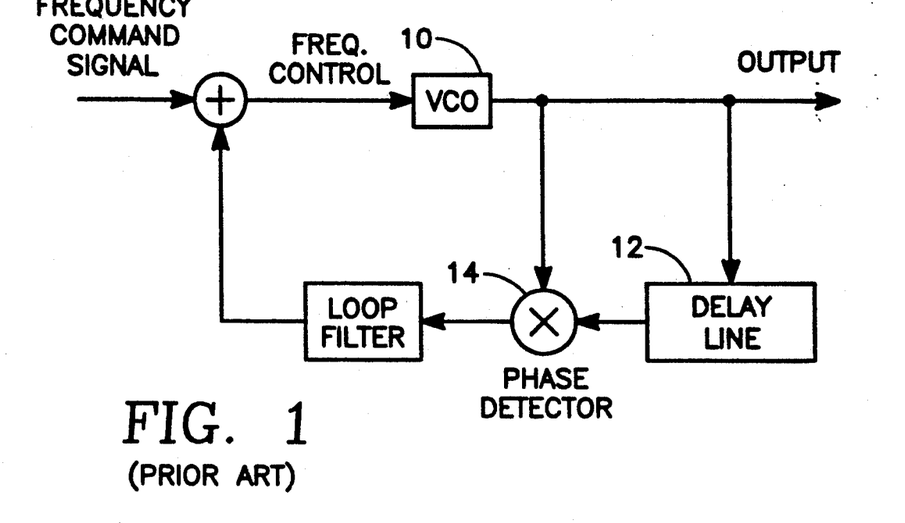
FIG. 1 is a block diagram depicting a prior art technique for stabilizing an electronic oscillator.

Stability of a typical frequency standard based upon an oscillator is limited by the natural tendency of the oscillator frequency to wander, producing phase noise in the system. One solution to this problem is to stabilize the oscillator frequency using a feedback loop. Referring to FIG. 1, if the oscillator 10 is a voltage-controlled oscillator (VCO), the frequency control voltage of the VCO 10 is derived from the error or difference between the current phase of the oscillator output signal and the phase of the oscillator signal measured at an earlier time. Typically, the error is measured in a delay line discriminator in which the oscillator signal of the earlier time is obtained by delaying the oscillator signal in a delay line 12, such as a coaxial cable for RF oscillators, and the phase difference is measured between the oscillator signals at the input and output of the delay line by a phase detector 14, as described in Andersen et. al., "RF Signal Generator Single-Loop Frequency Synthesis, Phase Noise Reduction and Frequency Modulation," *Hewlett Packard Journal*, October 1989, pages 27-33.

One problem with oscillator stabilization using a delay line discriminator is that the sensitivity of the discriminator is limited by the delay of the delay line. Any attempt to increase the sensitivity by increasing the delay requires a proportionate increase in the length of the delay line, which means that the discriminator is larger and heavier. Even a delay line length of 70 feet provides only a 70 nanosecond delay, which translates to relatively small discriminator sensitivity. Moreover, increasing the length of the delay line increases the signal losses therein and is ineffective at microwave and higher frequencies, due to high loss of metallic transmission media. Thus, it has not seemed practical to use a delay line discriminator for microwave or higher frequency (above 4 GHz) oscillators. Surface acoustic wave delay line devices have high insertion loss and are not widely tunable in a single device.

Therefore, discrimination for stabilizing microwave oscillators typically uses a very high-Q resonant cavity tuned to the desired oscillator frequency. Any deviation in oscillator frequency produces a phase shift in the signal produced by the resonance of the cavity, which is detected at the control input of the oscillator as an error signal. The problem with such a technique is that the oscillator frequency is fixed by the choice of resonant cavity. The response of the cavity at frequencies different from the cavity's own resonant frequency is poor. Unless the oscillator operates at the resonant frequency of the cavity, oscillator frequency stabilization cannot be effectively performed. Tunable cavities suffer from a low Q, and therefore do not provide as accurate a response. The Q of all cavities has second-order roll-off above 10 GHz, due to losses in metals, so that resonant cavities are not practical at higher frequencies (such as millimeter wave frequencies). Other prior art techniques attempt to overcome these limitations by stabilizing a lower frequency and then synthesizing a higher frequency from the lower frequency by frequency multiplication. This technique suffers from the disadvantage that the phase noise is also multiplied. Thus, it has not seemed possible to stabilize a microwave or higher frequency oscillator while at the same time significantly changing the frequency at which the oscillator is to be stabilized. Accordingly, a highly stabilized microwave or higher frequency tunable oscillator is unknown.

SUMMARY OF THE INVENTION

The invention is the stabilization of an oscillator with a fiber optic delay line discriminator, in which the fiber optic delay line length is sufficiently long (typically greater than 200 meters) to provide delays on the order of 1 microsecond or more. If the oscillator is electronic, its output is converted to a modulated light beam which is transmitted through the fiber optic delay line. In a preferred embodiment, this is accomplished by modulating the output of a laser with the oscillator. An optimum fiber optic delay line length has been found to be around 20 kilometers. Such a length is practical because the optical fiber exhibits a very small loss per length and because 20 kilometers of optical fiber fits in a container about 6 inches in diameter and 1 inch thick. In accordance with the invention, the oscillator frequency may be anywhere in a wide band between D.C. and optical frequencies, and can be tuned during operation. The band is wide because the losses in the optical fiber are not frequency dependent, and therefore can be used at millimeter and sub-millimeter wavelength oscillator signals. In order to tune the frequency, a variable phase shifter is employed at one input to the discriminator which establishes an initial phase relationship (such as quadrature) between the signals produced at the oscillator and at the output of the delay line, in accordance with the requirements of the phase detector employed in the discriminator. The phase shift of the variable phase shifter is slewed as the user makes large changes in the frequency of the oscillator, so as to maintain the desired initial phase relationship in the discriminator. In an alternative embodiment, the user can perform fine tuning by adjusting the phase shifter.

In another embodiment of the invention, the C.W. output of the oscillator can be pulsed (turned on and off) while remaining stable as long as the time between pulses is less than the delay time fiber optic delay line.

In yet another embodiment of the invention, the laser producing the modulated light beam is a mode-locked laser whose mode-locked frequency is the frequency of the oscillator signal being stabilized. In this embodiment, either the mode-locked laser is modulated by the oscillator or else the mode-locked laser itself serves as both oscillator and light source so as to eliminate the need for a separate oscillator. One significant advantage of this embodiment is that the mode locked laser has much lower noise.

DETAILED DESCRIPTION OF THE INVENTION

Figure 2A:
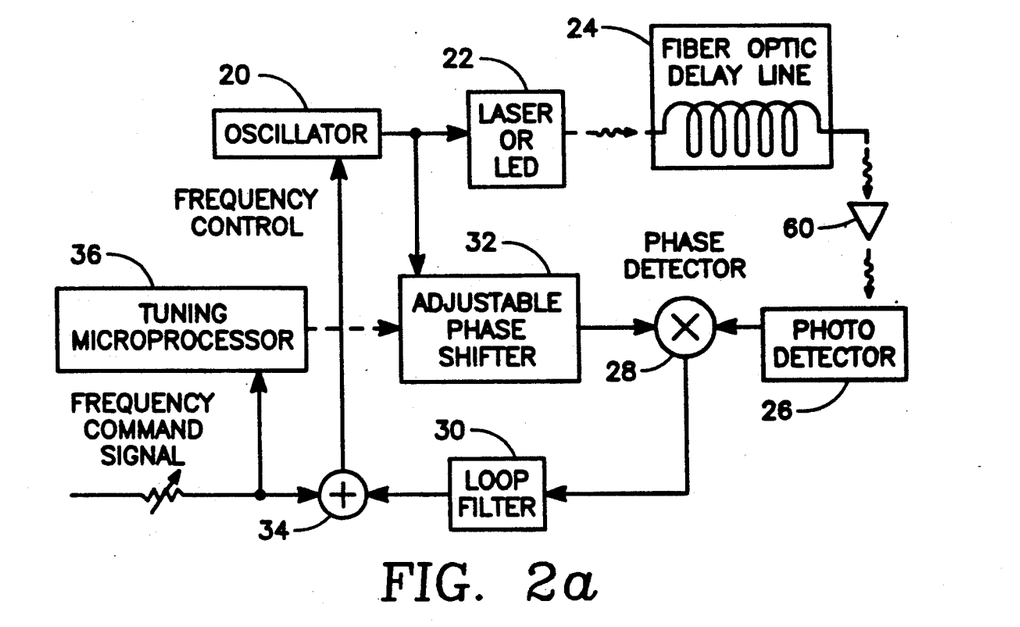
FIG. 2a is a block diagram illustrating a first embodiment of the invention with an electronic oscillator and an electronic phase detector circuit.

Referring to FIG. 2a, the output of an electronic oscillator 20 which is to be stabilized, such as an RF voltage controlled oscillator (VCO), modulates the output of an optical transmitter 22 such as a laser or a light emitting diode (LED). The output of the optical transmitter 22 is an RF linear intensity-modulated optical signal, which is coupled to the input of a fiber optic delay line 24. Preferably, the fiber optic delay line 24 is an optical fiber on the order of 20 kilometers in length and wound in a spool of about 6 or 8 inches in diameter and about 1 inch thick. The output of the fiber optic delay line is coupled to an opto-electronic transducer 26 such as photo-detector diode, whose output is a delayed version of the output electronic signal of the oscillator 20. Both signals are coupled to a phase detector 28, whose output controls the frequency of the VCO 20 through a loop filter 30. Typically, the phase detector 28 requires that the delayed and undelayed oscillator signals be in phase quadrature at equilibrium. Therefore, a phase shifter 32 at one input to the phase detector 28 typically imposes a 90 degree phase shift on one of the two signals.

Unlike coaxial cable delay lines of the prior art, the fiber optic delay line 24 exhibits a wide bandwidth or low attenuation from D.C. to optical frequencies of signals modulating the light beam of the optical transmitter 22. Therefore, in accordance with another feature of the invention, the user is permitted to tune the frequency of the oscillator 20 over this frequency range. For this purpose, the phase shifter 32 imposes a variable phase shift which slews with any user-commanded changes in the oscillator frequency in order to establish quadrature once the desired oscillator frequency has been reached. The error signal at the output of the loop filter 30 is summed with the user's frequency command signal at a summing node 34, the output of which is applied to the frequency control input of the oscillator 20. A tuning microprocessor 36 determines the phase shift imposed by the variable phase shifter 32 in accordance with the user's frequency command signal, so that any changes in the user's frequency command signal causes a corresponding change in the phase shift imposed by the variable phase shifter 32. Together the optical transmitter 22, the fiber optic delay line 24, the phase detector 28 and the adjustable phase shifter 32 comprise a delay line discriminator.

Figure 2B:
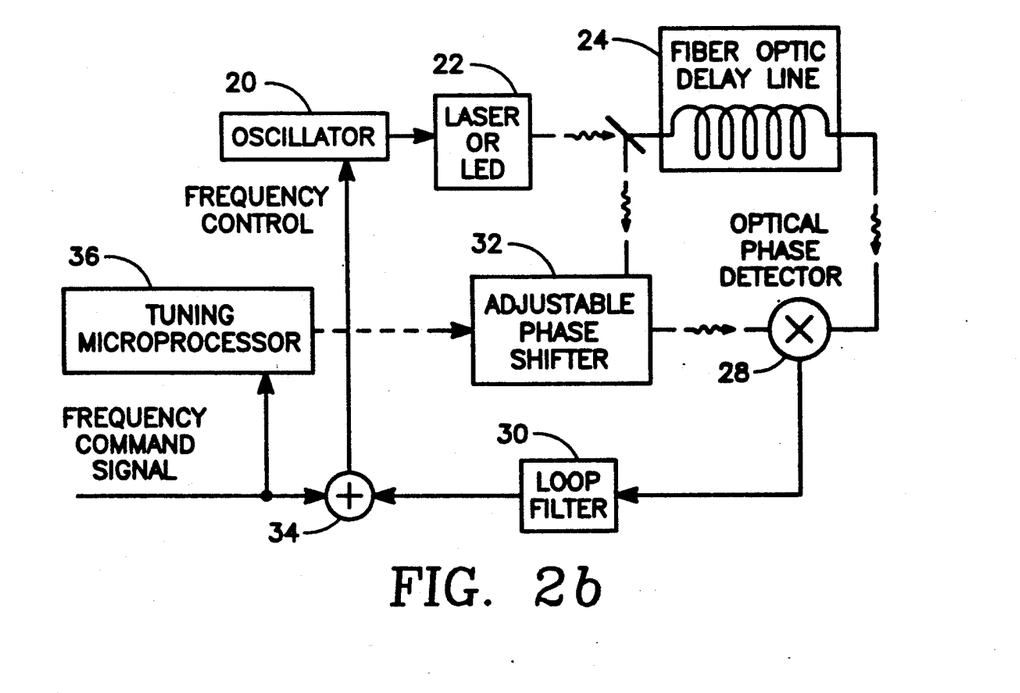
FIG. 2b is a block diagram illustrating a second embodiment of the invention corresponding to that of FIG. 2a but having an optical phase detector circuit.

In FIG. 2b, the delay line discriminator is a purely optical device, wherein the phase detector 28 is an optical phase detector which senses the phase difference between the modulating signals carried by the two input light beams. In this case, the two light beams are the output of the optical transmitter 22 (transmitted through the adjustable phase shifter 32) and the output of the fiber optic delay line 24. The output beam of the optical transmitter 22 is split between the input to the fiber optic delay line 24 and the input to the adjustable phase shifter 32, as indicated in FIG. 2b. In FIG. 2b the adjustable phase shifter 32 is an optical phase shifter of the type well-known in the art, and may be thought of as a short variable length air gap in the optical connection between the optical transmitter 22 and the optical phase detector 28, the gap being on the order of one wavelength of the modulating signal. It is understood that the optical paths depicted in the drawings are provided by optical fibers.

Figure 3A:
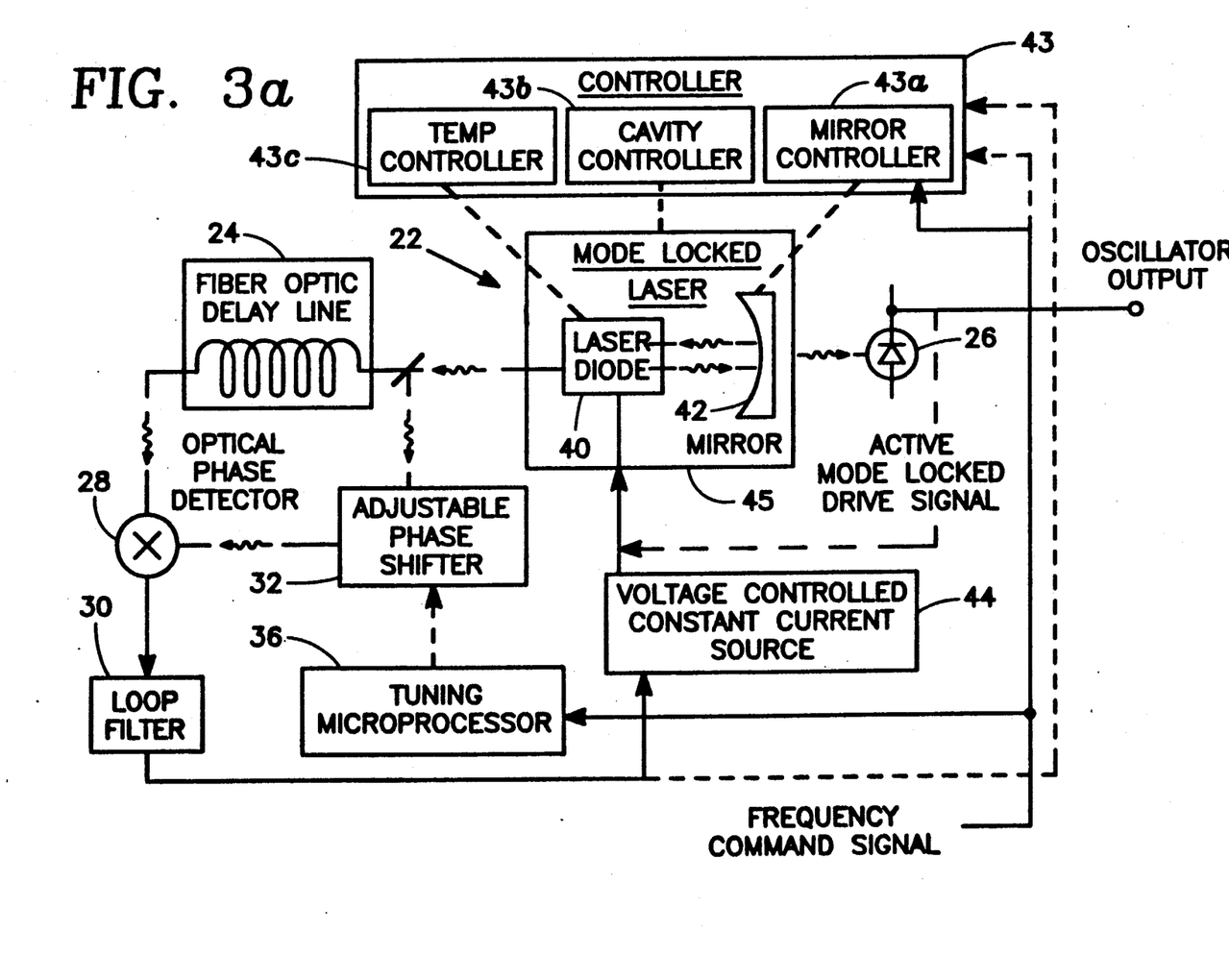
FIG. 3a is a block diagram illustrating a third embodiment of the invention employing a mode-locked laser as the oscillator with an optical phase detector circuit.

The embodiment of FIG. 3a corresponds to a modification of the embodiment of FIG. 2b in which the laser 22 is a mode locked laser which also serves the function of a tunable oscillator, so that the oscillator 20 is dispensed with. The mode locked laser 22 of FIG. 3a typically consists of a laser diode 40 and a mirror 42 whose optical path displacement from the laser diode 40 determines the mode locked oscillation frequency of the laser 22. In one embodiment the user's oscillator frequency command signal (for gross oscillator frequency changes within a wide band) governs the optical path length between the mirror 42 relative and the laser diode 40 to produce very large changes in oscillator frequency through a controller 43. In one embodiment, the controller 43 includes a mirror controller 43a governing the position of the mirror relative to the laser diode 40 in response to the frequency command signal. The loop filter 30 produces an error signal governing the small or fine corrections in oscillator frequency necessary for frequency stabilization. In one embodiment, this error signal varies a voltage controlled current source 44 which powers the laser diode 40 governing the optical carrier frequency of the mode locked laser 22. In another embodiment, the error signal from the loop filter 30 is transmitted to the mirror controller 43a so as to provide fine variations in the position of the mirror 42 relative to the laser diode 40. In a further embodiment, the error signal from the loop filter 30 is transmitted to a cavity controller 43b. The cavity controller 43b responds to the error signal by varying the refractive index of the optical medium between the mirror 42 and the laser diode 40 by any one of several well-known techniques such as varying the gas pressure inside the laser cavity 45 or tilting a piece of glass (or other refractive material) disposed between the laser diode 40 and the mirror 42 to change the effective thickness of the glass in the optical path. In yet another embodiment, the error signal from the loop filter 30 is transmitted to a temperature controller 43c so as to vary the temperature of the laser diode 40.

In an alternative embodiment of the invention, the user's frequency command signal may control a selected one of the controllers 43a, 43b, 43c included in the controller 43.

If the mode locked laser 22 is of the type which is actively mode locked, then the photo diode 26 senses the laser output light beam transmitted through the mirror 42, and its output is summed with the output of the voltage controlled current source 44, the resulting current being the power source applied to the laser diode 40. If the mode locked laser 22 is passively mode locked, then the diode 26 is dispensed with.

Figure 3B:
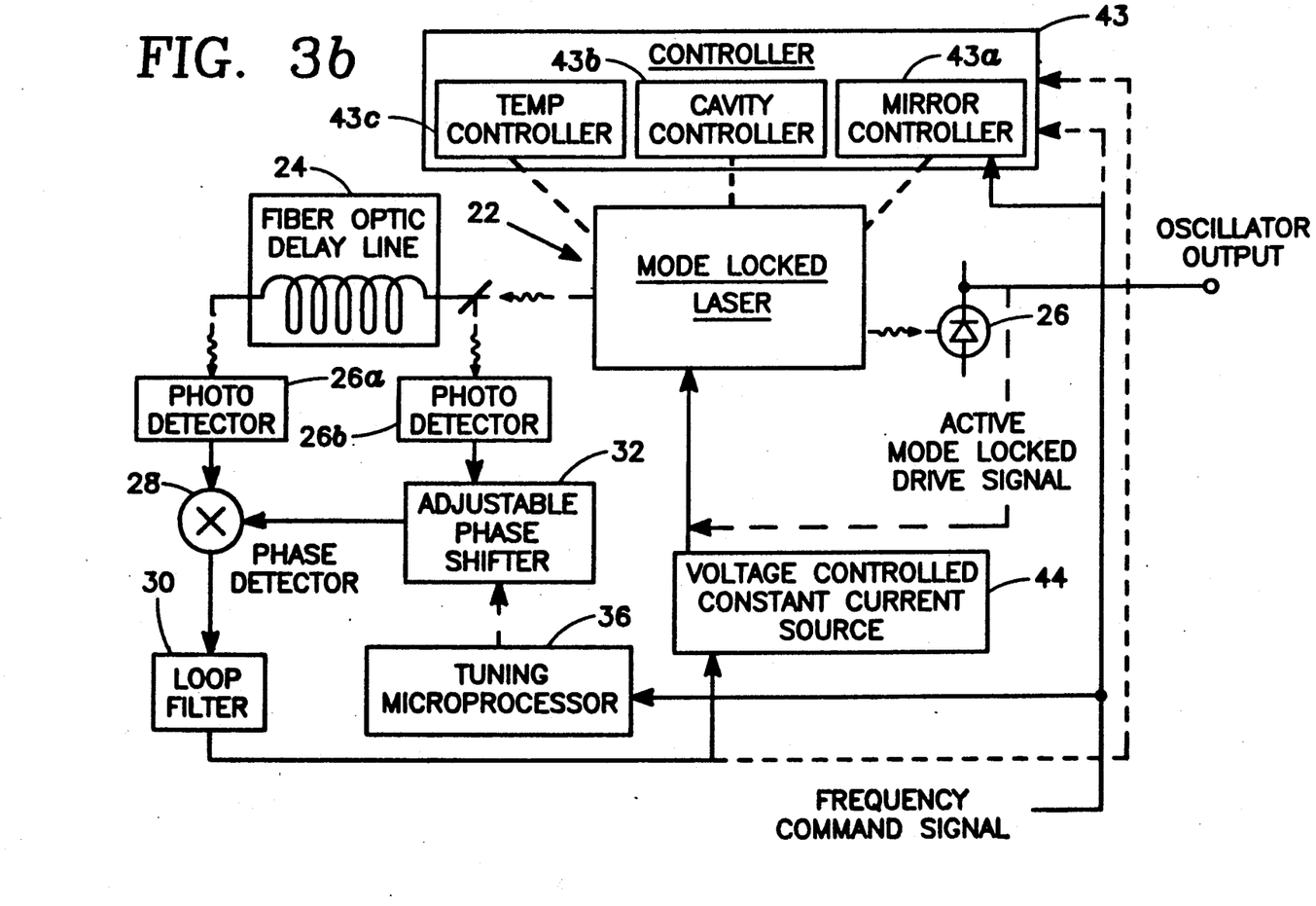
FIGS. 3b and 3c are block diagrams of variations of the embodiment of FIG. 3a including, respectively, an electronic phase detector and an electronic oscillator.

The embodiment of FIG. 3b is a modification of the embodiment of FIG. 3a in which the phase detector 28 is electronic rather than optical, which requires two photo detector diodes 26a, 26b for converting the optical signals from the laser 22 and from the output of the fiber optic delay line 24 to electrical signals detected by the phase detector 28.

Figure 3C:
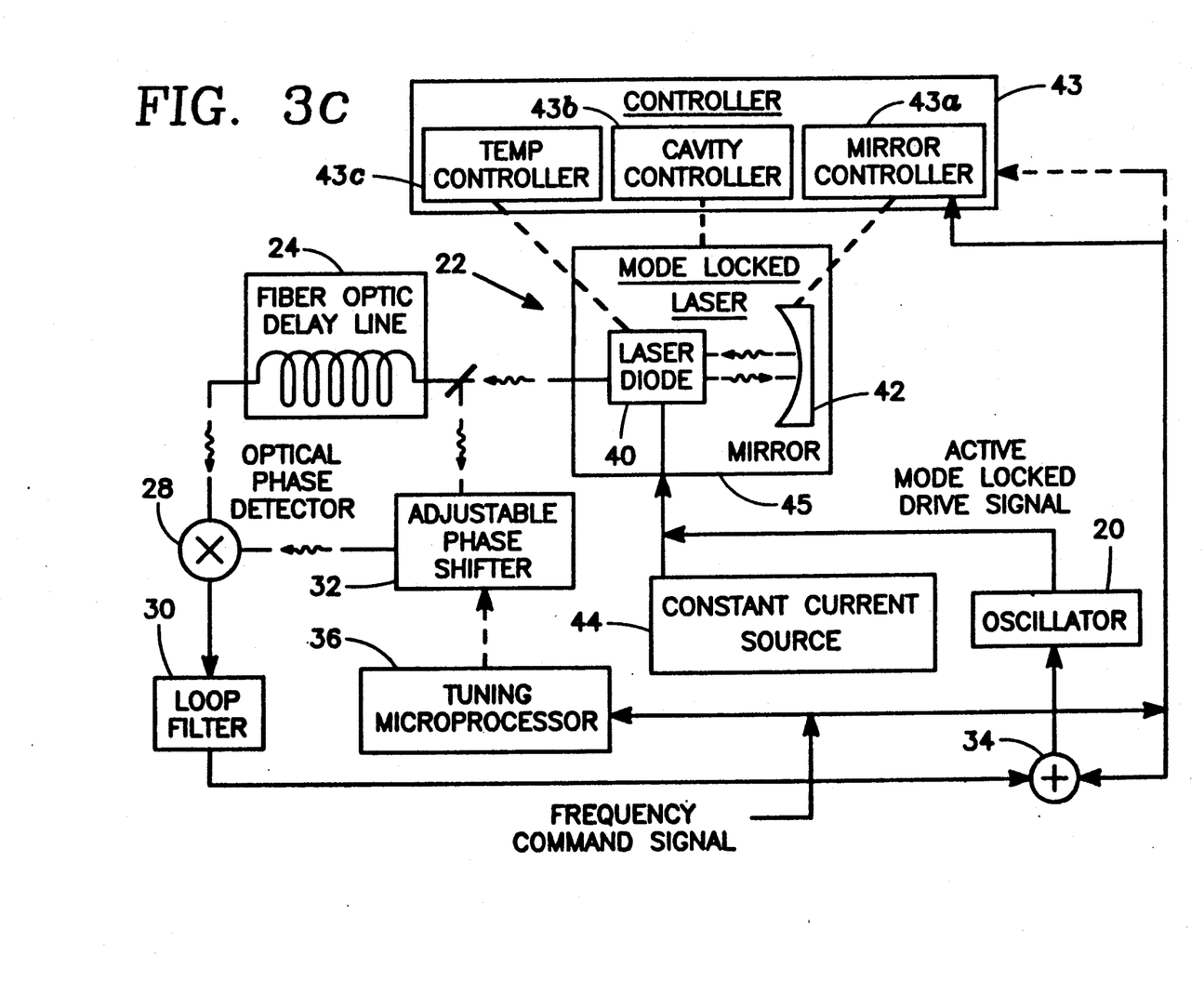

FIG. 3c illustrates a modification of FIG. 3a in which the oscillator 20 modulates the laser 22 as in FIGS. 2a and 2b. In this case, the oscillator 20 is a voltage controlled oscillator whose output provides the active mode locked drive signal combined with the output of the constant current source. The error signal from the loop filter 30 is connected only to the summing node 34 with the frequency command signal, the output of the summing node 34 controlling the frequency of the oscillator 20. In this embodiment, the output of the loop filter 30 corrects the frequency of the oscillator 20 and indirectly corrects the mode-locked frequency of the laser 22 through the active mode locked drive signal furnished to the laser 22 by the oscillator 20.

Figure 4:
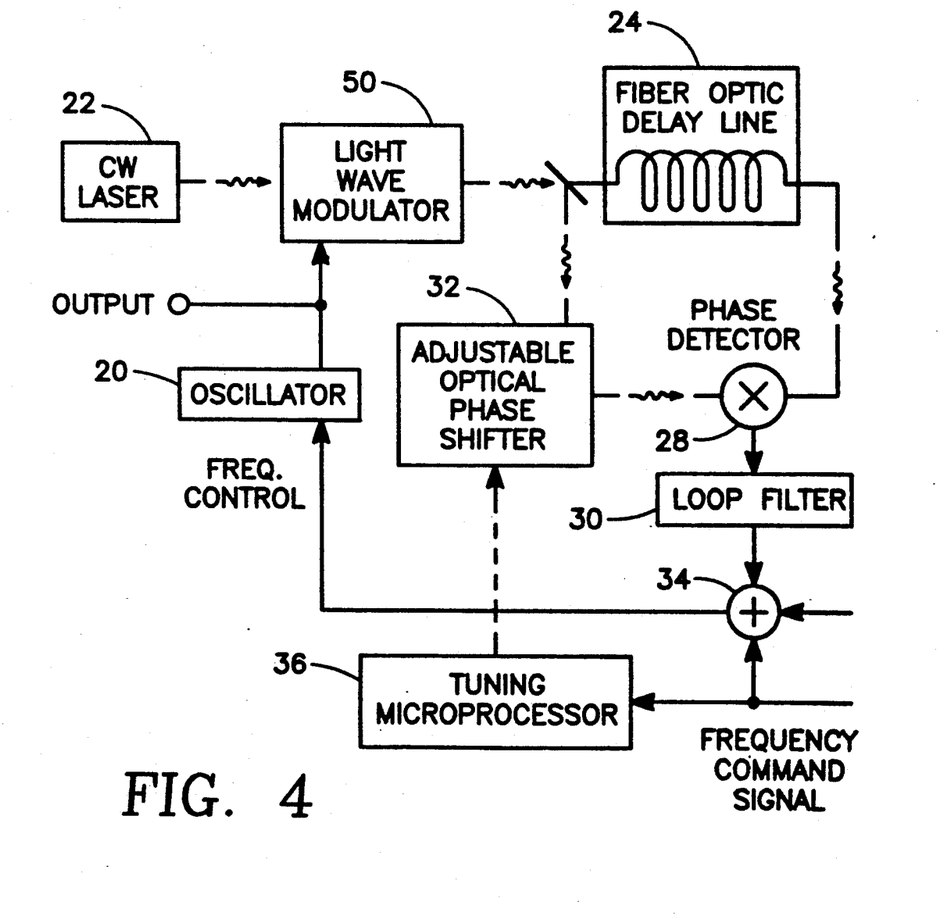
FIG. 4 is a block diagram of a fifth embodiment of the invention employing a C.W. laser electro-optically modulated by an oscillator and an optical phase detector circuit.

FIG. 4 illustrates an embodiment in which the laser 22 is a continuous wave (C.W.) laser whose output amplitude is modulated by a light wave modulator 50 controlled by the output amplitude of the oscillator 20. The light wave modulator 50 may be either an electro-optical device such as a lithium niobate light wave modulator or a mechanical device. In the embodiment of FIG. 4, the oscillator 20 may be any type of oscillator including an electronic VCO or a mode locked laser, for example.

Figure 5:
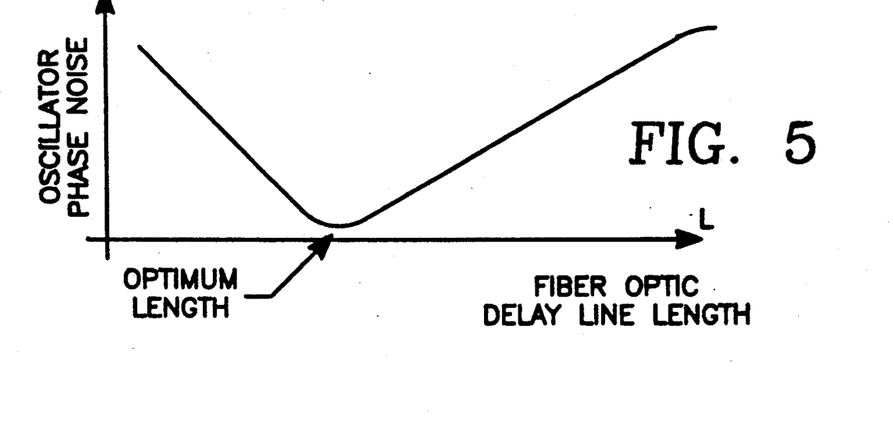
FIG. 5 is a graph illustrating oscillator phase noise as a function of fiber optic delay line length.

FIG. 5 qualitatively illustrates how the phase noise (frequency instability) in the oscillator 12 varies as a function of the length of the fiber optic delay line 24. Initially, as the length increases, the delay line discriminator sensitivity increases, so that the oscillator phase noise decreases. At the minimum noise amplitude, however, the length-dependent attenuation losses in the fiber optic delay line 24 begin to dominate, and the phase noise begins to increase as the length increases. Preferably, the skilled worker first determines the location of the minimum in FIG. 5 from his system design specifications and then selects the fiber optic delay line length accordingly. The mathematical basis of this empirical determination has been described by the inventor and others in "Stabilization of Oscillator Phase Using a Fiber-Optic Delay Line", *Proceedings of the 45th Annual Symposium on Frequency Control, IEEE Ultrasonics, Ferroelectrics and Frequency Control Society,* May 29–31, 1991, Los Angeles, CA. Typically, it has been found that the optimum fiber optic delay line length in many cases is on the order of 10 to 20 kilometers.

If the oscillator stability is to be further improved, an optical amplifier 60 illustrated in FIG. 2a may be imposed at the output of the fiber optic delay line 24, or may be distributed along the entire length of the fiber optic delay line 24. The optical amplifier 60 may be of the type well-known in the art, such as a pumped Er-doped optical fiber. Depending upon the gain of the optical amplifier 60, the minimum of the noise curve in FIG. 5 is moved to the right, thereby increasing the optimum fiber optic delay line length for greater discriminator sensitivity and hence superior phase noise performance.

Figure 6A:
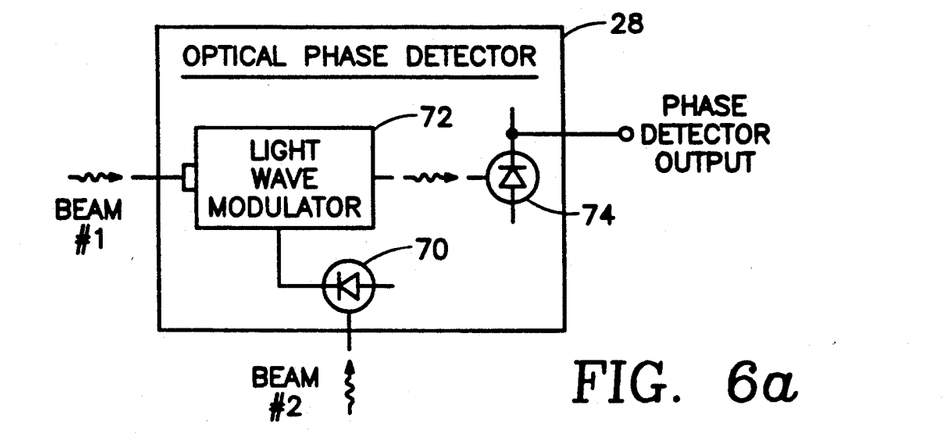
FIG. 6a illustrates an optical phase detector useful in the embodiments of FIGS. 2b, 3a, 3c and 4.

FIG. 6a illustrates an optical phase detector of the type used as the phase detector 28 in the embodiments of FIGS. 2b, 3a, 3c and 4. The optical phase detector of FIG. 6a generates an electric signal proportional to the phase difference between two intensity modulated input light beams, and includes a photo detector diode 70 which senses one of the input beams and whose output controls an electro-optical light wave modulator 72 which modulates the other input light beam. The light wave modulated by the modulator 72 is detected by another photo detector diode 74, whose output is the electric signal representing the phase difference between the modulations of the two input light beams.

Figure 6B:
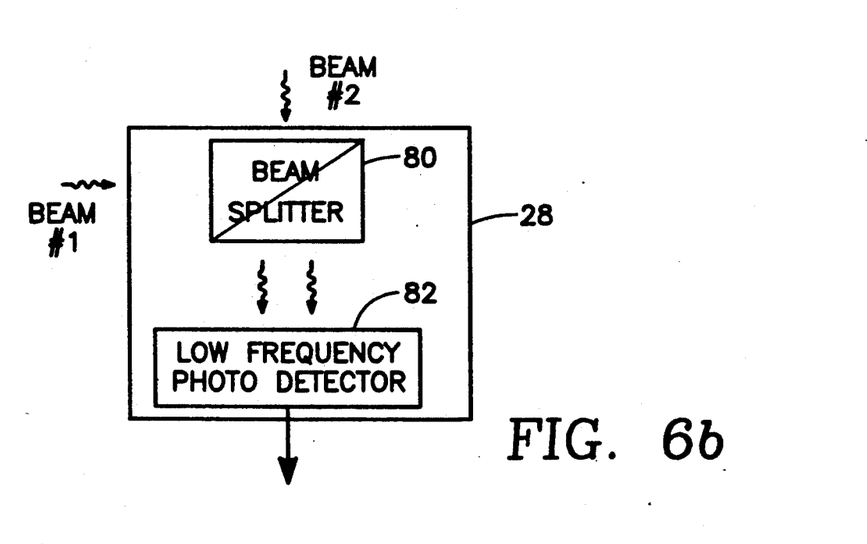
FIG. 6b illustrates an optical phase detector useful in an embodiment of FIG. 4 in which the laser output is phase modulated with the oscillator output signal.

In the above-described embodiments of the invention, the output of the laser 22 is an optical carrier which is amplitude modulated with an oscillator signal. However, in an alternative embodiment of the invention the laser optical carrier is phase modulated as a function of the amplitude of the oscillator signal. This may be accomplished in the embodiment of FIG. 4, for example, by selecting the light wave modulator 50 to be of the conventional type which phase modulates the output of the laser 22 as a function of the oscillator output signal. In this case, the phase detector 28 is implemented as shown in FIG. 6b. In this embodiment, the phase modulated light beams from the adjustable optical phase shifter 32 and from the fiber optic delay line 24 are fed to the two inputs of a beam splitter 80, the output of which is detected by a low frequency photodetector or diode 82. The low frequency photodetector generates an output signal whose amplitude is a function of the amount of constructive interference between the two beams in the beam splitter 80. It is understood that the beam splitter 80 may be a 50–50 fiber optic coupler of the type well-known in the art.

In another alternative embodiment of the invention, the laser output is frequency modulated as a function of the amplitude of the oscillator signal rather than being phase modulated. This may accomplished in the embodiment of FIG. 2a, for example, by selecting the laser 22 to be of the commercially available type having an FM terminal which controls the laser output frequency. In this case, the connection between the oscillator 20 and the laser 22 is made at the laser's FM terminal, and the photodetector 26 is replaced by a coherent optical FM demodulator of the type well-known in the art.

In accordance with conventional design principles, the loop filter 30 filters out side bands above the reciprocal of the delay time of the optical fiber delay line 24.

While the invention has been described in detail with specific reference to preferred embodiments thereof, it is understood that variations and modifications thereof may be made without departing from the true spirit and scope of the invention.

What is claimed is:

1. A method for stabilizing an oscillator device having an oscillator output signal and a frequency control input, said method comprising:
   transmitting through a long optical fiber delay line an optical carrier with modulation corresponding to said oscillator output signal whereby to produce a delayed version of said optical carrier including said modulation;

sensing a phase difference between the modulation of said optical carrier and the modulation of said delayed version of said optical carrier, whereby to generate an error signal; and feeding back said error signal to said oscillator frequency control input so as to change said frequency in such a way as to decrease said error signal;

wherein said oscillator device comprises a mode locked laser producing said optical carrier amplitude-modulated at a mode locking frequency of said laser, said mode locking frequency being the frequency of said oscillator output signal, said mode locked laser comprising a laser diode and a mirror displaced from said laser diode by an optical path length corresponding to said mode locking frequency, wherein said step of feeding back and changing said frequency comprises one of:

(a) changing a power source current applied to said laser diode;

(b) altering an effective optical path length between said laser diode and said mirror by changing an effective index of refraction of an optical path between said laser diode and said mirror;

(c) changing the position of said mirror relative to said laser diode.

2. A circuit for stabilizing the frequency of an oscillator output signal of an oscillator device, comprising:

delay line means comprising a long optical fiber receiving at one end thereof an optical output signal modulated by said oscillator output signal and transmitting at an opposite end thereof a delayed version of said optical output signal representing a delayed version of said oscillator output signal;

phase detector means for detecting a change in a phase relationship between said oscillator output signal and said delayed version of said oscillator output signal; and means responsive to said phase detector means for changing the frequency of said oscillator output signal so as to counteract said change in phase relation whereby to stabilize said frequency;

wherein said phase detector means and said delay line means comprise a delay line discriminator characterized by a sensitivity which is a function of the length of said optical fiber, said delayed optical output signal is attenuated in said optical fiber as a function of said length, and said length is such as to optimize said sensitivity against said attenuation.

3. The circuit of claim 2 wherein said optical fiber is on the order of 10 kilometers in length.

4. The circuit of claim 2 further comprising:

adjustable phase shifter means for imposing a phase shift on ne of (a) said oscillator output signal and (b) said delayed optical output signal as detected by said phase detector means;

tuning means responsive to an externally controlled change in the frequency to which said oscillator output signal is to be stabilized, for making a corresponding change in the phase shift imposed by said adjustable phase shifter means whereby to establish a predetermined phase relationship between said oscillator output signal and said delayed oscillator output signal against which said phase detector means measures said changes.

5. The circuit of claim 4 wherein said predetermined relationship is phase quadrature.

6. The circuit of claim 1 wherein said oscillator device comprises a voltage controlled RF oscillator generating an RF signal and an optical transmitter characterized by an optical carrier modulated by said RF signal.

7. The circuit of claim 6 wherein said optical transmitter comprises a laser.

8. The circuit of claim 6 wherein said phase detector means is an electronic phase detector having two inputs, said circuit further comprising photodetector means for converting said delayed optical output signal to a delayed electric output signal and said pair of inputs of said phase detector means are connected, respectively, to receive said oscillator output signal and said delayed electric output signal.

9. The circuit of claim 6 wherein said means for changing the frequency of said oscillator output signal comprises:

a loop filter connected to an output of said phase detector means;

a summing node receiving (a) an output of said loop filter and (b) and external frequency command; and means for connecting an output of said summing node to a frequency control input of said voltage controlled oscillator.

10. A circuit for stabilizing the frequency of an oscillator output signal of an oscillator device, comprising:

delay line means comprising a long optical fiber receiving at one end thereof an optical output signal modulated by said oscillator output signal and transmitting at an opposite end thereof a delayed version of said optical output signal representing a delayed version of said oscillator output signal;

phase detector means for detecting a change in a phase relationship between said oscillator output signal and said delayed version of said oscillator output signal; and means responsive to said phase detector means for changing the frequency of said oscillator output signal so as to counteract said change in phase relationship, whereby to stabilize said frequency;

wherein said phase detector means comprises an optical phase detector having two inputs, said system further comprising beam splitter means for dividing said optical output signal into a pair of optical output signals, one of said pair of optical output signals being transmitted through said optical fiber and the other being transmitted to one input of said optical phase detector, said opposite end of said optical fiber being coupled to the other input of said optical phase detector.

11. The circuit of claim 6 wherein said optical transmitter comprises a C.W. laser, said circuit comprising a light wave modulator modulating the output beam of said laser in synchronism with said RF signal of said RF oscillator.

12. A circuit for stabilizing the frequency of an oscillator output signal of an oscillator device, comprising:

delay line means comprising a long optical fiber receiving at one end thereof an optical output signal modulated by said oscillator output signal and transmitting at an opposite end thereof a delayed version of said optical output signal representing a delayed version of said oscillator output signal;

phase detector means for detecting a change in a phase relationship between said oscillator output signal and said delayed version of said oscillator output signal; and means responsive to said phase detector means for changing the frequency of said oscillator output signal so as to counteract said change in phase relationship, whereby to stabilize said frequency;

wherein said oscillator device comprises a mode locked laser having an optical carrier amplitude-modulated at a mode locking frequency of said laser, said amplitude-modulated optical carrier comprising said optical output signal and said mode locked laser comprising a laser diode and a mirror displaced from said laser diode by an optical path length corresponding to said mode locking frequency.

13. The circuit of claim 12 further comprising:
adjustable phase shifter means for imposing a phase shift on one of (a) said oscillator output signal and (b) said delayed optical output signal as detected by said phase detector means;
tuning means responsive to an externally commanded change in the frequency to which the frequency of said optical output signal is to be stabilized, for making a corresponding change in the phase shift imposed by said adjustable phase shifter means whereby to establish a predetermined phase relationship between said optical output signal and said delayed optical output signal against which said phase detector means measures said changes 14. The circuit of claim 13 further comprising laser tuning means responsive to said externally commanded change in the frequency for changing a mode locking frequency of said mode locked laser, said laser tuning means comprising one of:
means for changing a power source current applied to said laser diode;
means for altering an effective optical path length between said laser diode and said mirror by changing an effective index of refraction of an optical path between said laser diode and said mirror;
means for changing the position of said mirror relative to said laser diode.

15. The circuit of claim 12 wherein said means for changing the frequency of said oscillator output signal comprises one of:
means for changing a power source current applied to said laser diode;
means for altering an effective optical path length between said laser diode and said mirror by changing an effective index of refraction of an optical path between said laser diode and said mirror;
means for changing the position of said mirror relative to said laser diode.

16. The circuit of claim 12 wherein said phase detector means comprises an optical phase detector having a pair of optical inputs, said circuit further comprising a beam splitter for splitting an output laser beam of said mode locked laser into a pair of beams transmitted, respectively, to said optical fiber and one of said optical inputs of said phase detector means, said other optical input being coupled to said opposite end of said optical fiber.

17. The circuit of claim 2 wherein the modulation of said optical output signal by said oscillator output signal is one of:
(a) intensity modulation;
(b) frequency modulation;
(c) phase modulation.

18. A circuit for stabilizing an oscillator device having an oscillator output signal and a frequency control input, comprising:
a long optical fiber delay line which receives at one end thereof an optical carrier with modulation corresponding to said oscillator output signal and transmits at another end thereof a delayed version of said optical carrier including said modulation;
a phase detector for sensing a phase difference between the modulation of said optical carrier and the modulation of said delayed version of said optical carrier, whereby to generate an error signal; and
means for feeding back said error signal to said oscillator frequency control input;
wherein said frequency control input is capable of varying said frequency across a band lying in a range from microwave to optical frequencies.

19. The circuit of claim 18 wherein said phase detector and said delay line comprise a delay line discriminator, and the length of the optical fiber is selected so as to optimize sensitivity of said discriminator against signal attenuation in the optical fiber.

20. The circuit of claim 19 wherein the optical fiber length is on the order of 10 kilometers.

21. The circuit of claim 18 further comprising:
an adjustable phase shifter for maintaining a predetermined phase relationship between the signals sensed by said phase detector at equilibrium;
tuning means for adjusting a phase shift imposed by said adjustable phase shifter in response to an externally commanded change in the frequency of said oscillator output signal, whereby to permit tuning of said oscillator output frequency over a range generally between D.C. and optical frequencies.

22. A circuit for stabilizing an oscillator device having an oscillator output signal and a frequency control input, comprising:
a long optical fiber delay line which receives at one end thereof an optical carrier with modulation corresponding to said oscillator output signal and transmits at another end thereof a delayed version of said optical carrier including said modulation;
phase detector for sensing a phase difference between the modulation of said optical carrier and the modulation of said delayed version of said optical carrier, whereby to generate an error signal; and
means for feeding back said error signal to said oscillator frequency control input;
wherein said oscillator device comprises a mode locked laser which generates said optical carrier, wherein the frequency of said oscillator output signal is a mode locking frequency of said laser, said circuit further comprising means for changing said mode locking frequency in response to an externally commanded change.

23. The circuit of claim 18 wherein the modulation of said optical output signal is a function of the amplitude of said oscillator signal and is one of:
(a) intensity modulation;
(b) frequency modulation;
(c) phase modulation.

24. A method for stabilizing an oscillator device having an oscillator output signal and a frequency control input, said method comprising:
transmitting through a long optical fiber delay line an optical carrier with modulation corresponding to said oscillator output signal whereby to produce a delayed version of said optical carrier including said modulation;

sensing a phase difference between the modulation of said optical carrier and the modulation of said delayed version of said optical carrier, whereby to generate an error signal;

feeding back said error signal to said oscillator frequency control input so as to change said frequency in such a way as to decrease said error signal; and controlling said frequency input in a frequency band laying in a range from microwave to optical frequencies.

25. The method of claim 24 wherein the length of the optical fiber is selected so as to optimize sensitivity of said sensing step to fluctuations in the frequency of said oscillator against signal attenuation in the optical fiber.

26. The method of claim 25 wherein the optical fiber length is on the order of 10 kilometers.

27. The method of claim 24 further comprising:

maintaining a pre-determined phase relationship between the signals sensed by said sensing step by imposing an adjustable phase shift on one of said signals;

adjusting said adjustable phase shift in response to an externally commanded change in the frequency of said oscillator output signal, whereby to permit tuning of said output frequency over a range generally between D.C. and optical frequencies.

28. The method of claim 24 wherein the modulation of said optical output signal is carried out as a function of the amplitude of said oscillator output signal by one of the following methods:
(a) intensity modulation;
(b) frequency modulation;
(c) phase modulation.

* * * * *